US010229735B1

(12) United States Patent
Natarajan et al.

(10) Patent No.: US 10,229,735 B1
(45) Date of Patent: Mar. 12, 2019

(54) BLOCK MANAGEMENT FOR DYNAMIC SINGLE-LEVEL CELL BUFFERS IN STORAGE DEVICES

(71) Applicant: Intel Corporation, Santa Clara, CA (US)

(72) Inventors: Shankar Natarajan, Folsom, CA (US); Sriram Natarajan, Folsom, CA (US); Suresh Nagarajan, Folsom, CA (US); Ramkarthik Ganesan, Folsom, CA (US); Arun S. Athreya, Folsom, CA (US); Romesh B. Trivedi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/852,928

(22) Filed: Dec. 22, 2017

(51) Int. Cl.
*G06F 12/06* (2006.01)
*G11C 11/56* (2006.01)
*G11C 16/16* (2006.01)
*G11C 16/20* (2006.01)

(52) U.S. Cl.
CPC ...... *G11C 11/5635* (2013.01); *G06F 12/0646* (2013.01); *G11C 16/16* (2013.01); *G11C 16/20* (2013.01)

(58) Field of Classification Search
CPC .................................................. G06F 12/0646
See application file for complete search history.

(56) References Cited

U.S. PATENT DOCUMENTS

| 8,667,215 | B2* | 3/2014 | Marotta | G11C 16/16 |
| | | | | 711/103 |
| 8,832,507 | B2* | 9/2014 | Post | G06F 11/1048 |
| | | | | 714/718 |
| 9,811,269 | B1 | 11/2017 | Ramalingam et al. | |
| 9,864,697 | B2* | 1/2018 | Hale | G06F 12/0897 |
| 2012/0173827 | A1* | 7/2012 | Wood | G11C 11/5621 |
| | | | | 711/154 |
| 2012/0311293 | A1* | 12/2012 | Nemazie | G11C 16/0483 |
| | | | | 711/171 |
| 2016/0364337 | A1* | 12/2016 | Hale | G06F 12/0897 |
| 2018/0107603 | A1* | 4/2018 | Hale | G06F 12/0897 |

OTHER PUBLICATIONS

"Samsung 960 EVO: Fast speeds and affordable prices", retrieved from legitreview.com/print?post_id=188027, retrieved on Nov. 18, 2017, 32 pages.

* cited by examiner

*Primary Examiner* — Hoai V Ho
*Assistant Examiner* — Jay Radke
(74) *Attorney, Agent, or Firm* — Jordan IP Law, LLC

(57) ABSTRACT

Systems, apparatuses and methods may provide for technology to determine a programmable eviction ratio associated with a storage device and convert a portion of a single-level cell region in the storage device into a multi-level cell region in accordance with the programmable eviction ratio. In one example, the amount of the portion converted into the multi-level cell region varies gradually as a function of percent capacity filled in the storage device.

25 Claims, 6 Drawing Sheets

......... Static SLC scheme
--- Dynamic SLC scheme 1
— — Dynamic SLC scheme 2
——— Enhanced dynamic SLC

BLOCK MANAGEMENT FOR DYNAMIC SINGLE-LEVEL CELL BUFFERS IN STORAGE DEVICES

TECHNICAL FIELD

Embodiments generally relate to memory structures.

BACKGROUND

Single-level cell (SLC) buffers may include NAND-type flash memory ("NAND memory") that is organized into multiple cells, with each cell containing one bit of data. Tri-level cell (TLC) memory may include NAND memory that is organized into multiple cells, with each cell containing three bits of data. The number of bits per cell may generally depend on how many distinct voltage levels used during program operation(s) associated with writing to, reading from and/or erasing the cell. Thus, in the case of TLC memory, to support three bits per cell, eight voltage levels may be used to distinguish between the eight possible combinations of ones and zeros (e.g., 000, 001, 010, 011, 100, 101, 110, 111) written to the cell.

SLC buffers may generally be relatively fast to access (e.g., due to the single program voltage level), but may have a relatively low storage capacity. By contrast, TLC memory may be relatively slow to access, but may have a higher storage capacity. Recent developments in memory technology may provide for using TLC memory as part of the SLC buffer in order to avoid the slower access times associated with TLC memory. Conventional solutions, however, for converting TLC memory regions to SLC memory regions, and back again, may use inefficient conversion policies that lead to suboptimal performance and/or a failure to meet quality of service (QOS) constraints placed on the storage device.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
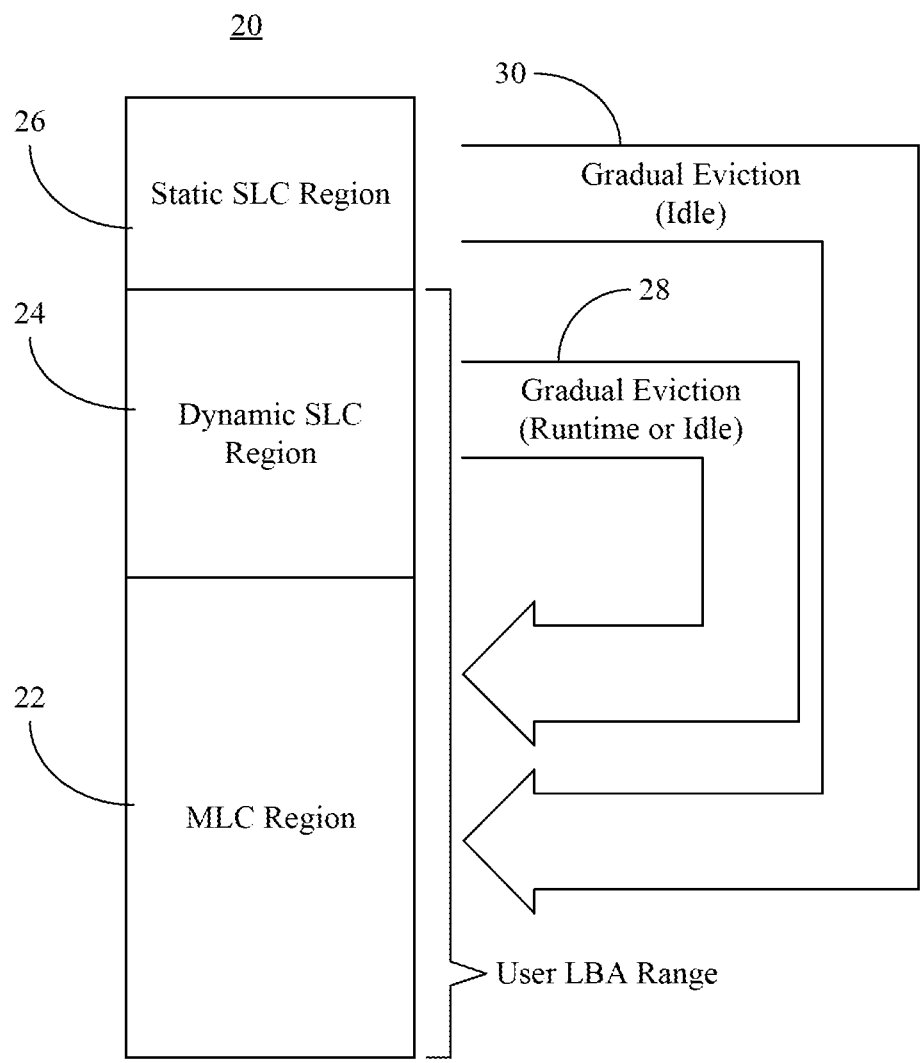
FIG. 1 is a block diagram of an example of a memory structure according to an embodiment.

Turning now to FIG. 1, a memory structure 20 is shown in which memory blocks in a multi-level cell (MLC) region 22 may be converted into dynamic single-level cell (SLC) region 24 memory blocks. Each cell in the MLC region 22 may generally be programmed to contain multiple bits of data. For example, if the MLC region 22 includes tri-level cell (TLC) memory, each cell in the MLC region 22 may be programmed to contain three bits of data, if the MLC region 22 includes quad-level cell (QLC) memory, each cell in the MLC region 22 may be programmed to contain four bits of data, and so forth.

Thus, converting the memory blocks in the MLC region 22 into the dynamic SLC region 24 memory blocks may involve reducing the number of distinct voltage levels used to program the converted memory blocks, which may in turn increase the speed at which the converted blocks can be programmed. Accordingly, the conversion may improve the write bandwidth of the dynamic SLC region 24. Because the illustrated dynamic SLC (DSLC) region 24 resides—along with the illustrated MLC region 22—in a user-accessible logical block address (LBA) range, a user of the memory structure 20 may perceive the improved write bandwidth in the form of enhanced performance and faster writes to the dynamic SLC region 24. A static SLC region 26 (e.g., SLC buffer) may reside outside the user-accessible LBA range.

Once the dynamic SLC region 24 is filled with data, writes may then be directed to spare memory in the static SLC region 26 and the data in the dynamic SLC region 24 may be "evicted" to the MLC region 22 so that the full expected capacity of the LBA range may be available to the user. Thus, memory blocks in the dynamic SLC region 24 formerly containing evicted data may be subsequently used as the MLC region 22 memory blocks, which have a greater storage capacity (e.g., three-bit TLC, four-bit QLC, and so forth). As will be discussed in greater detail, evictions 28 from the dynamic SLC region 24 to the MLC region 22 may occur gradually in accordance with a programmable eviction ratio. The gradual nature of the evictions 28, which may occur when the memory structure 20 is in a runtime state (e.g., actively writing data) or when the memory structure 20 is in an idle state (e.g., not actively writing data), may enable the memory structure 20 to more readily meet quality of service (QOS) constraints such as, for example, consistent/predictable write bandwidth, minimum storage capacity, and so forth. Thus, defining the eviction ratio as a function of the percent capacity filled in the memory structure 20 may result in a consistent steady state performance. Moreover, establishing the eviction ratio as a programmable value may provide greater flexibility and/or scalability (e.g., as QOS constraints may change over time). Additionally, gradual evictions 30 of data from the static SLC region 26 to the MLC region 22 may be conducted when the memory structure 20 is in the idle state.

Figure 2:
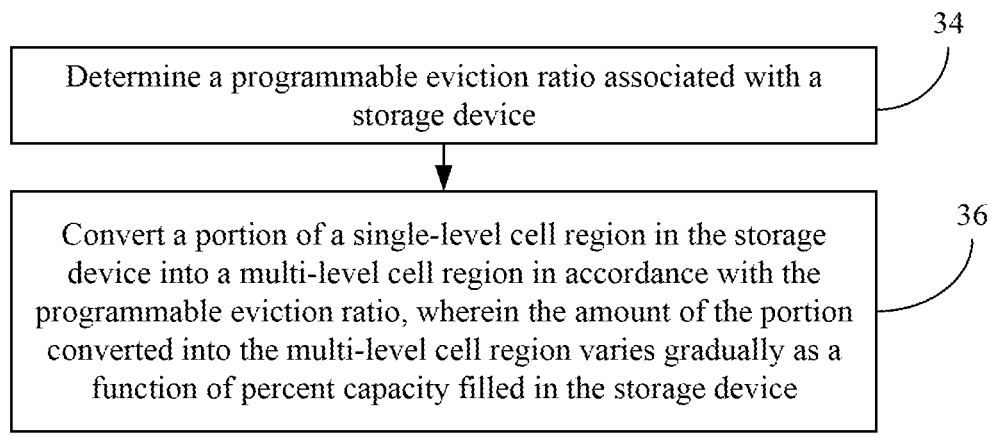
FIG. 2 is a flowchart of an example of a method of operating a memory controller according to an embodiment.

FIG. 2 shows a method 32 of operating a memory controller. The method 32 may generally be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

For example, computer program code to carry out operations shown in the method 32 may be written in any combination of one or more programming languages, including an object oriented programming language such as JAVA, SMALLTALK, C++ or the like and conventional procedural programming languages, such as the "C" programming language or similar programming languages. Additionally, logic instructions might include assembler instructions, instruction set architecture (ISA) instructions, machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, etc.).

Illustrated processing block 34 provides for determining a programmable eviction ratio associated with a storage device. When the storage device is in a runtime state, block 34 may include retrieving the programmable eviction ratio from a data structure (e.g., configuration table, relational database, etc.) dedicated to the runtime state. By contrast, when the storage device is in an idle state, block 34 might include retrieving the programmable eviction ratio from a data structure dedicated to the idle state.

A portion of an SLC region in the storage device may be converted at processing block 36 into an MLC region in accordance with the programmable eviction ratio. The amount of the portion converted into the MLC region may vary gradually as a function of percent capacity filled in the storage device. When the storage device is in the runtime state, the portion converted into the MLC region may be from a dynamic SLC region. When the storage device is in the idle state, the portion converted into the MLC region may be from either a static SLC (SSLC) region or a dynamic SLC region, with the dynamic SLC region having a lower eviction priority than the static SLC region. Prioritization of the static SLC region over the dynamic SLC region may enhance performance, particularly if the only opportunity to evict data from the static SLC region is during the idle state.

Figure 3:
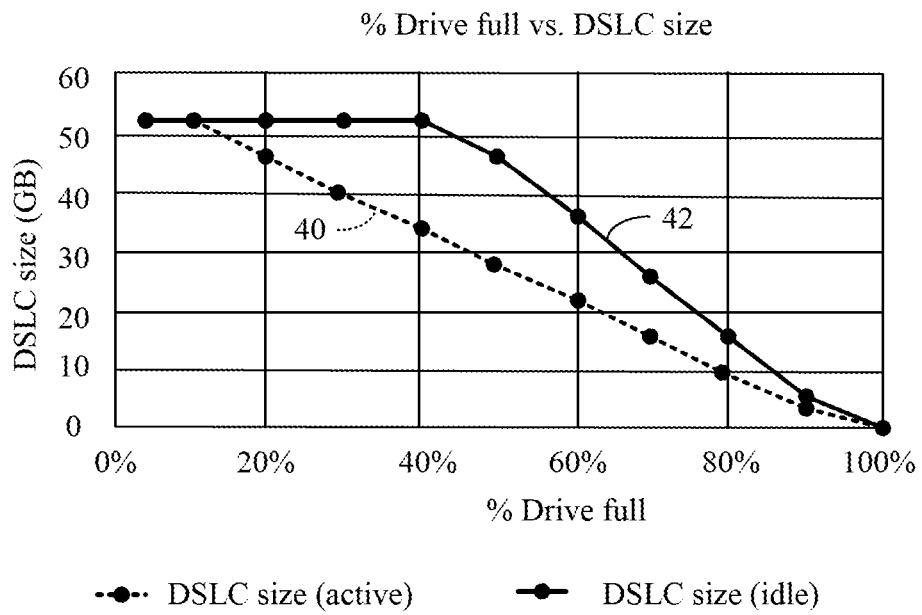
FIG. 3 is a plot of an example of gradual memory region conversions during runtime and idle states according to embodiments.

FIG. 3 shows a plot 38 of memory region conversions. In the illustrated example, a runtime curve 40 demonstrates that during the runtime state the size of the dynamic SLC may be gradually reduced as a function of percent capacity filled in the storage device (e.g., solid state drive/SSD). Thus, the runtime conversion may begin at approximately 10% of drive capacity and decrease at an approximately 45° slope until the storage device is completely full. Additionally, an idle curve 42 may demonstrate that during the idle state the size of the dynamic SLC may again be gradually reduced as a function of percent capacity filled in the storage device. Thus, the idle conversion may begin at approximately 40% of drive capacity and decrease at a slightly steeper slope until the storage device is completely full.

Figure 4A:
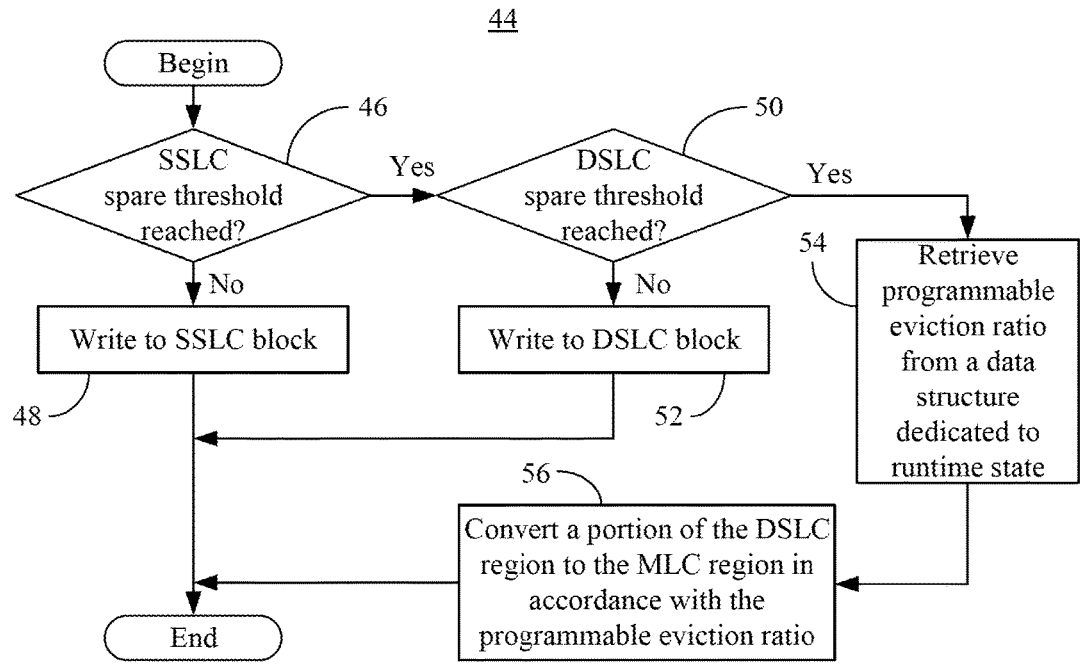
FIG. 4A is a flowchart of an example of a method of evicting memory regions during a runtime state according to an embodiment.

FIG. 4A shows a method 44 of evicting memory regions while a storage device is in a runtime state. The method 44 may generally be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS, TTL technology, or any combination thereof.

Illustrated processing block 46 provides for determining whether an SSLC spare threshold has been reached. If not, a write operation is conducted on a memory block in the SSLC region at illustrated processing block 48 and the method 44 may terminate. Otherwise, a determination may be made at processing block 50 as to whether a DSLC spare threshold has been reached. If not, a write operation is conducted on a memory block in the DSLC region at illustrated processing block 52 and the method 44 may terminate. If the DSLC spare threshold has been reached, block 54 may retrieve a programmable eviction ratio from a data structure dedicated to the runtime state. Accordingly, illustrated block 56 converts a portion of the DSLC region to the MLC region in accordance with the programmable eviction ratio and the method 44 may terminate. As already noted, the size of the portion converted into the MLC region may vary gradually as a function of the percent capacity filled in the storage device.

Figure 4B:
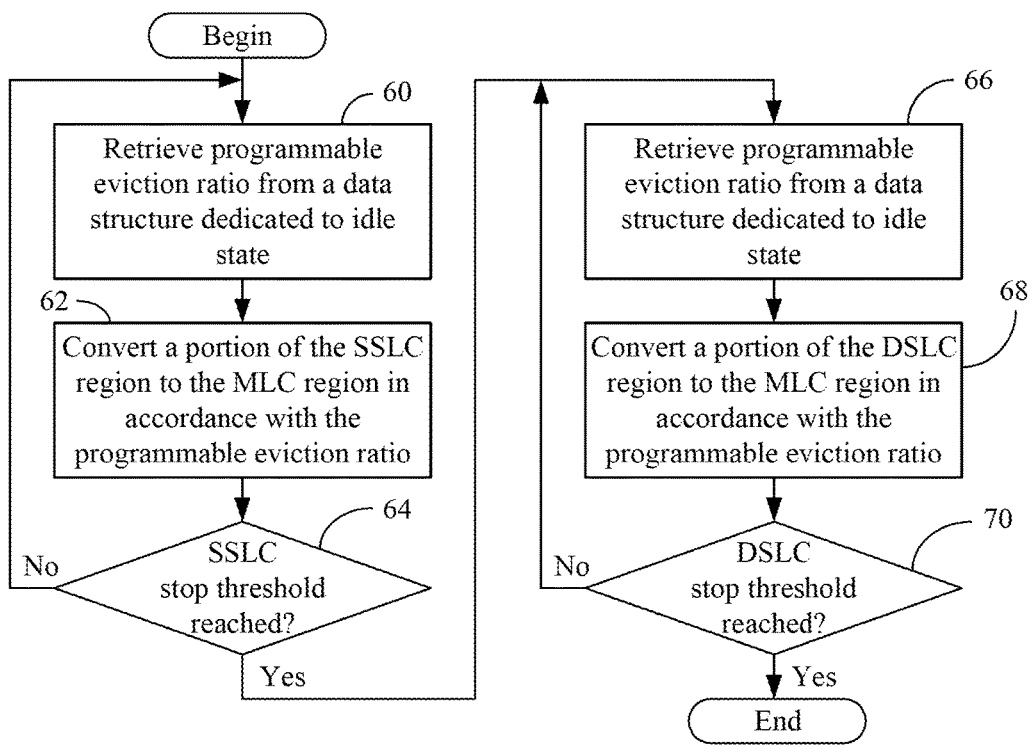
FIG. 4B is a flowchart of an example of a method of evicting memory regions during an idle state according to an embodiment.

FIG. 4B shows a method 58 of evicting memory regions during an idle state. The method 58 may generally be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS, TTL technology, or any combination thereof.

Illustrated processing block 60 may provide for retrieving a programmable eviction ratio from a data structure dedicated to the idle state, wherein a portion of the SSLC region may be converted at processing block 62 to the MLC region in accordance with the programmable eviction ratio. A determination may be made at processing block 64 as to whether an SSLC stop threshold has been reached. If not, the illustrated method 58 repeats processing blocks 60 and 62. Otherwise, processing block 66 may retrieve a programmable eviction ratio from the data structure dedicated to the idle state. Additionally, processing block 68 may provide for converting a portion of the DSLC region to the MLC region in accordance with the programmable eviction ratio. A determination may be made at processing block 70 as to whether a DSLC stop threshold has been reached. If not, the illustrated method 58 repeats processing blocks 66 and 68. Once the DSLC stop threshold has been reached, the method 58 may terminate.

Figure 5:
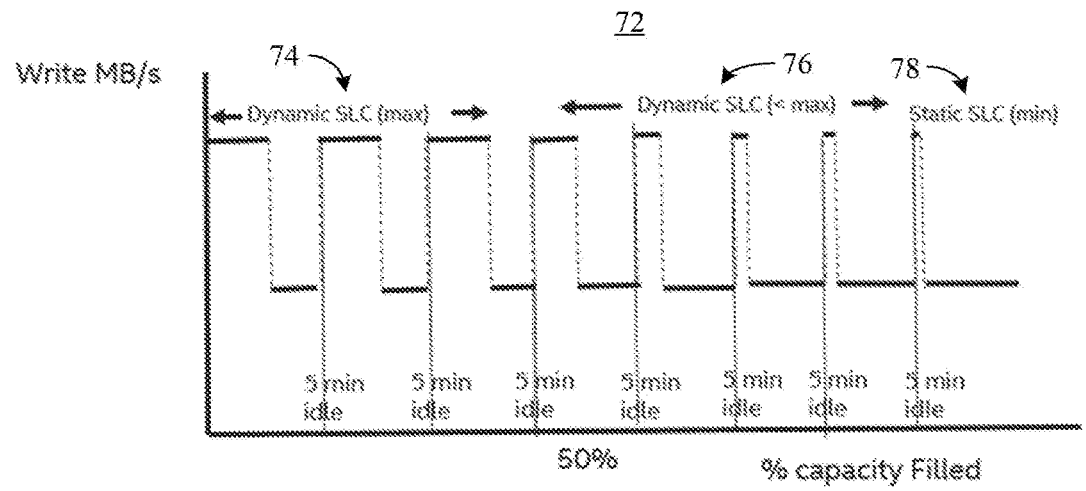
FIG. 5 is a plot of an example of idle state write bandwidth according to an embodiment.

Turning now to FIG. 5, a plot 72 of idle state bandwidth is shown for relatively large idle times (e.g., five minutes). In the illustrated example, during a first time period 74, the DSLC size is held at a maximum value and sub-periods of write activity at the maximum write bandwidth are interspersed with evenly-sized sub-periods of inactivity. During a second time period 76, the DSLC size may be gradually reduced in size and sub-periods of write activity at the maximum write bandwidth may also reduce in size over time. During a third time period 78, writes may be conducted to the SSLC.

Figure 6:
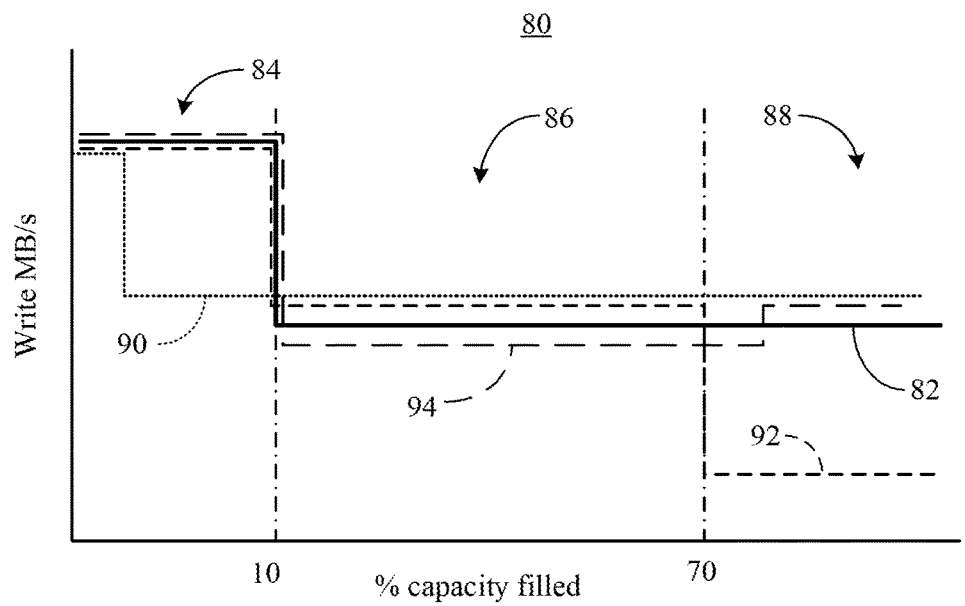
FIG. 6 is a comparative plot of an example of runtime state write bandwidth according to an embodiment.

FIG. 6 shows a comparative plot 80 of runtime state write bandwidth. In the illustrated example, an enhanced line profile 82 exhibits a relatively high write bandwidth during a first time period 84 (e.g., while writes are being directed to SSLC regions, then DSLC regions), and a lower write bandwidth during second time period 86 and a third time period 88 (e.g., while writes are being directed to SLC regions and then transferred to MLC regions). Of particular note is that during the second time period 86 and the third time period 88, a minimal conversion ratio may be used to convert the DSLC regions to the MLC regions. Accordingly, the storage device may more readily meet QOS constraints (e.g., consistent/predictable write bandwidth, minimum storage capacity, etc.). By contrast, a static SLC line profile 90 ("Static SLC scheme") may fail to take advantage of the performance benefits associated with writing to the DSLC regions during the first time period 84 and a first dynamic SLC line profile 92 ("Dynamic SLC scheme 1") may exhibit significantly reduced write bandwidth during the third time period 88 due to forced conversion from SLC to MLC. For line profile 92, the SLC to MLC conversion is delayed as long as possible and the forced conversion of SLC to MLC is conducted to free up required capacity to continue writing host data. The SLC to MLC data converted may be much greater than the new host data written. Accordingly, the host data bandwidth may be severely impacted during third time period 88. Additionally, a second dynamic SLC line profile 94 ("Dynamic SLC scheme 2") may exhibit a sudden spike in write bandwidth during the third time period 88.

A comparison between the approach used in the second dynamic SLC line profile 94 and the approach used in the enhanced line profile 82 is shown below in Table I.

| Eviction | | SLC evicted | SLC region to user after idle | |
|---|---|---|---|---|
| BW (MB/s) | Idle time(s) | during idle (GB) | Second Dynamic | Enhanced |
| 525 | 3 | 1.575 | 1.5 G SLC | 1.5 G SLC |
| 525 | 10 | 5.25 | 5 G SLC | 5.25 G SLC |
| 525 | 20 | 10.5 | 5 G SLC | 10.5 G SLC |
| 525 | 40 | 21 | 5 G SLC | 21 G SLC |
| 525 | 45 | 23.625 | 22 G SLC | 23.625 G SLC |

Thus, the enhanced solution provided herein may provide more evicted capacity to the user sooner, relative to the second dynamic approach.

Figure 7:
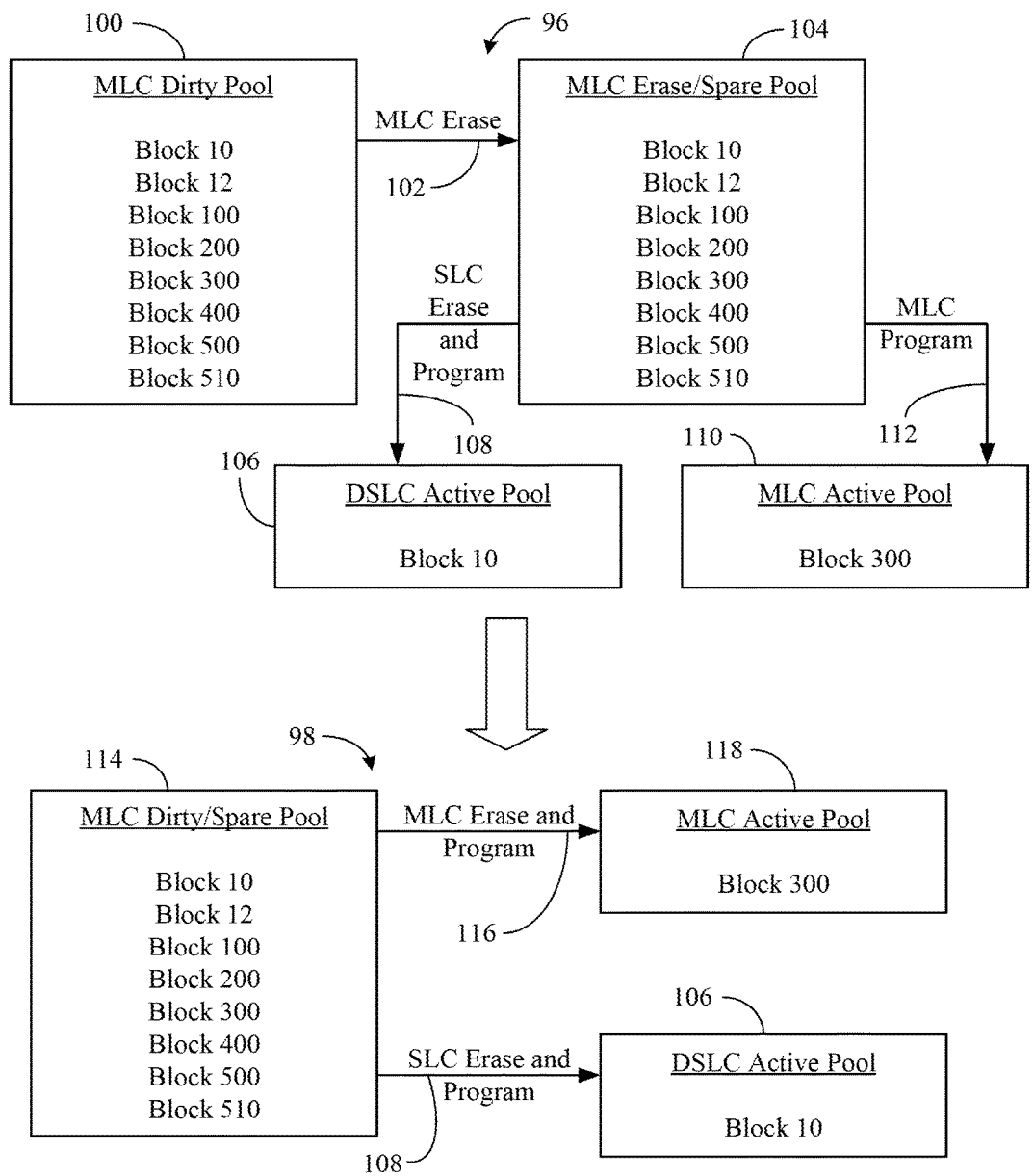
FIG. 7 is a comparative block diagram of an example of a set of erase operations according to an embodiment.

FIG. 7 shows a comparative set of erase operations. In the illustrated example, a conventional sequence 96 is replaced by an enhanced sequence 98. More particularly, under the illustrated conventional sequence 96, an MLC dirty pool 100 initially contains a plurality of invalid memory blocks (e.g., "Block 10", "Block 12", etc.). An MLC erase operation 102 may be conducted on all of the invalid memory blocks in the MLC dirty pool 100. As a result, an MLC erase/spare pool 104 may contain all of the invalid memory blocks after the MLC erase operation 102. In the illustrated example, a first memory block (e.g., "Block 10") is placed into a DSLC active pool 106 by conducting SLC erase and program operations 108 on the first memory block. Additionally, a second memory block (e.g., "Block 300") may be placed into an MLC active pool 110 by conducting an MLC program operation 112 on the second memory block. Thus, two erase operations are conducted on the first memory block under the conventional sequence 96, in the illustrated example.

By contrast, an MLC dirty/spare pool 114 may initially contain the plurality of invalid memory blocks under the enhanced sequence 98. In the illustrated example, the first memory block is moved directly from the MLC dirty/spare pool 114 to the DSLC active pool 106 by conducting the SLC erase and program operations 108 on the first memory block. Additionally, the second memory block may be moved directly from the MLC dirty/spare pool 114 to the MLC active pool 118 by conducting MLC erase and program operations 116 on the second memory block. Accordingly, the illustrated enhanced sequence 98 eliminates an erase operation for memory blocks that are moved from the MLC dirty/spare pool 114 to the DSLC active pool 106. As a result, wear on the memory regions may be reduced, which may in turn increase the life span and/or reduce the power consumption of the storage device.

Figure 8:
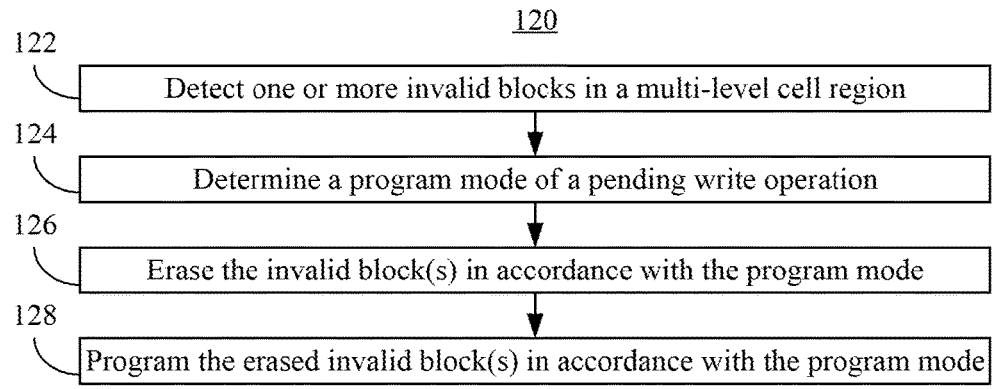
FIG. 8 is a flowchart of an example of a method of erasing memory blocks according to an embodiment.

FIG. 8 shows a method 120 of erasing memory blocks. The method 120 may generally be implemented in one or more modules as a set of logic instructions stored in a machine- or computer-readable storage medium such as RAM, ROM, PROM, firmware, flash memory, etc., in configurable logic such as, for example, PLAs, FPGAs, CPLDs, in fixed-functionality hardware logic using circuit technology such as, for example, ASIC, CMOS, TTL technology, or any combination thereof.

Illustrated processing block 122 provides for detecting one or more invalid blocks in an MLC region, wherein a program mode of a pending write operation may be determined at processing block 124. The program mode may be, for example, either an SLC program mode or an MLC program mode. Processing block 126 may erase the invalid block(s) in accordance with the program mode. Additionally, the erased invalid block(s) may be programmed in accordance with the determined program mode at block 128.

Figure 9:
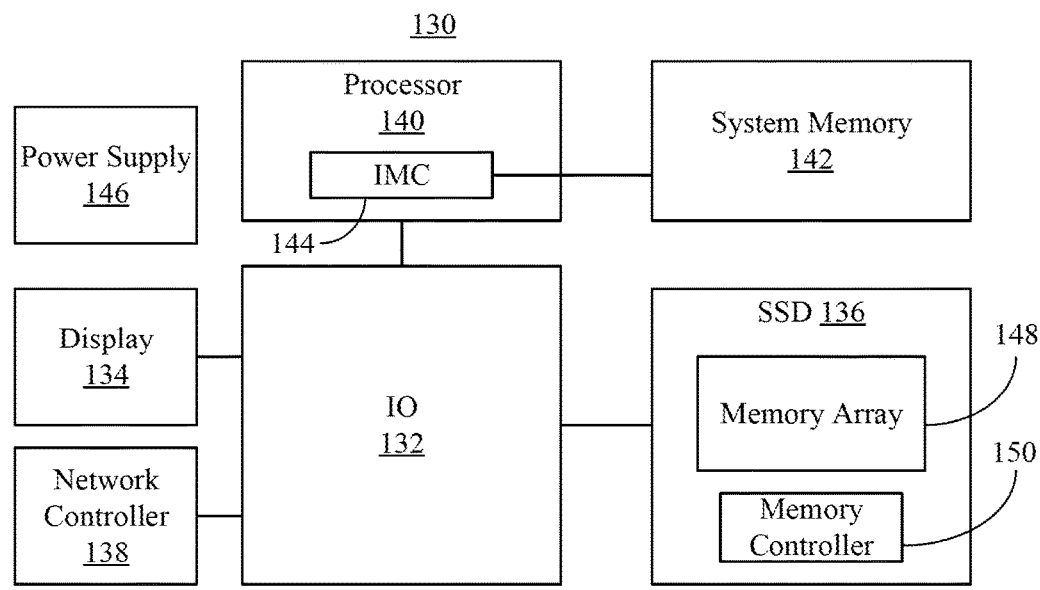
FIG. 9 is a block diagram of an example of a computing system according to an embodiment.

Turning now to FIG. 9, a computing system 130 is shown. The system 130 may generally be part of a server, desktop computer, notebook computer, tablet computer, convertible tablet, smart television (TV), personal digital assistant (PDA), mobile Internet device (MID), smart phone, wearable device, media player, etc., or any combination thereof. In the illustrated example, a power supply 146 provides power to the components of the system 130 and an input/output (IO) module 132 is communicatively coupled to a display 134 (e.g., liquid crystal display/LCD, light emitting diode/LED display, touch screen), a solid state drive (SSD) 136 and a network controller 138 (e.g., wired, wireless). The system 130 may also include a host processor 140 (e.g., central processing unit/CPU) that includes an integrated memory controller (IMC) 144, wherein the illustrated IMC 144 communicates with a system memory 142 over a bus or other suitable communication interface. The host processor 140 and the 10 module 132 may be integrated onto a shared semiconductor die (not shown) in a system on chip (SoC) architecture.

The illustrated SSD 136 includes a memory array 148 having a single-cell region (e.g., static and dynamic) and a multi-level cell (e.g., TLC, QLC) region. Thus, the memory array 148 may be similar to the memory structure 20 (FIG. 1), already discussed. The SSD 136 may also include a memory controller 150 having logic (e.g., logic instructions, configurable logic, fixed-functionality hardware logic, etc., or any combination thereof) to perform one or more aspects of the method 32 (FIG. 2), the method 44 (FIG. 4A), the method 58 (FIG. 4B) and/or the method 120 (FIG. 8), already discussed. Thus, during operation, the memory controller 150 may determine a programmable eviction ratio associated with the SSD 136 and convert a portion of the SLC region into the MLC region in accordance with the programmable eviction ratio. As already noted, the amount of the portion converted into the MLC region may vary (e.g., gradually) as a function of (e.g., is proportional to) percent capacity filled in the SSD 136.

The memory array 148 may include either volatile memory or non-volatile memory. Non-volatile memory is a storage medium that does not require power to maintain the state of data stored by the medium. In one embodiment, the SSD 136 is a block addressable storage device, such as those based on NAND or NOR technologies. A storage device may also include future generation nonvolatile devices, such as a three dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The storage device may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces.

Figure 10:
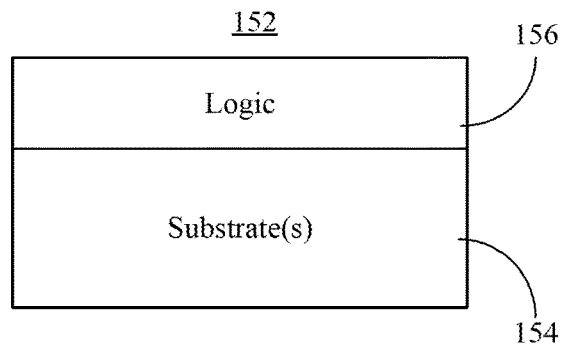
FIG. 10 is an illustration of an example of a semiconductor apparatus according to an embodiment.

FIG. 10 shows a semiconductor apparatus 152 (e.g., chip, die) that includes one or more substrates 154 (e.g., silicon, sapphire, gallium arsenide) and logic 156 (e.g., transistor array and other integrated circuit/IC components) coupled to the substrate(s) 154. The logic 156, which may be implemented at least partly in configurable logic and/or fixed-functionality hardware logic, may generally implement one or more aspects of the method 32 (FIG. 2), the method 44 (FIG. 4A), the method 58 (FIG. 4B) and/or the method 120 (FIG. 8), already discussed. Thus, the logic 156 may determine a programmable eviction ratio associated with a storage device and convert a portion of the SLC region into the MLC region in accordance with the programmable eviction ratio. As already noted, the amount of the portion converted into the MLC region may vary (e.g., gradually) as a function of percent capacity filled in the storage device. In one example, the logic 156 includes transistor channel regions that are positioned (e.g., embedded) within the substrate(s) 154. Thus, the interface between the logic 156 and the substrate(s) 154 may not be an abrupt junction. The logic 156 may also be considered to include an epitaxial layer that is grown on an initial wafer of the substrate(s) 154.

Additional Notes and Examples

Example 1 may include a semiconductor apparatus comprising one or more substrates and logic coupled to the one or more substrates, wherein the logic is implemented at least partly in one or more of configurable logic or fixed-functionality hardware logic, the logic coupled to the one or more substrates to determine a programmable eviction ratio associated with a storage device, convert a portion of a single-level cell region in the storage device into a multi-level cell region in accordance with the programmable eviction ratio, wherein an amount of the portion converted into the multi-level cell region is to vary gradually as a function of percent capacity filled in the storage device, detect one or more invalid blocks in the multi-level cell region, determine a program mode of a pending write operation, erase the one or more invalid blocks in accordance with the program mode, and program the erased one or more invalid blocks in accordance with the program mode, wherein the program mode is to be either a single-level cell program mode or a multi-level cell program mode, wherein when the storage device is in a runtime state, the programmable eviction ratio is to be retrieved from a data structure dedicated to the runtime state, and wherein when the storage device is in an idle state, the programmable eviction ratio is to be retrieved from a data structure dedicated to the idle state.

Example 2 may include the semiconductor apparatus of Example 1, wherein when the storage device is in the runtime state, the portion converted into the multi-level cell region is to be from a dynamic single-level cell region.

Example 3 may include the semiconductor apparatus of Example 1, wherein when the storage device is in the idle state, the portion converted into the multi-level cell region is to be from a static single-level cell region.

Example 4 may include the semiconductor apparatus of Example 1, wherein when the storage device is in the idle state, the portion converted into the multi-level cell region is to be from a dynamic single-level cell region having a lower eviction priority than a static single-level cell region of the storage device.

Example 5 may include a storage device comprising a power supply to provide power to the system, a memory array including a single-level cell region and a multi-level cell region, a memory controller including logic to determine a programmable eviction ratio associated with the storage device, and convert a portion of the single-level cell region into the multi-level cell region in accordance with the programmable eviction ratio, wherein an amount of the portion converted into the multi-level cell region is to vary gradually as a function of percent capacity filled in the storage device.

Example 6 may include the storage device of Example 5, wherein the memory controller is to detect one or more invalid blocks in the multi-level cell region, determine a program mode of a pending write operation, erase the one or more invalid blocks in accordance with the program mode, and program the erased one or more invalid blocks in accordance with the program mode.

Example 7 may include the storage device of Example 6, wherein the program mode is to be either a single-level cell program mode or a multi-level cell program mode.

Example 8 may include the storage device of Example 5, wherein when the storage device is in a runtime state, the programmable eviction ratio is retrieved from a data structure dedicated to the runtime state and the single-level cell region is a dynamic single-level cell region.

Example 9 may include the storage device of any one of Examples 5 to 8, wherein when the storage device is in an idle state, the programmable eviction ratio is to be retrieved from a data structure dedicated to the idle state.

Example 10 may include the storage device of Example 9, wherein the single-level cell region is a static single-level cell region.

Example 11 may include the storage device of Example 9, wherein the single-level cell region is a dynamic single-level cell region having a lower eviction priority than a static single-level cell region of the storage device.

Example 12 may include a semiconductor apparatus comprising one or more substrates, and logic coupled to the one or more substrates, wherein the logic is implemented at least partly in one or more of configurable logic or fixed-functionality hardware logic, the logic coupled to the one or more substrates to determine a programmable eviction ratio associated with a storage device, and convert a portion of a single-level cell region in the storage device into a multi-level cell region in accordance with the programmable eviction ratio, wherein an amount of the portion converted into the multi-level cell region is to vary gradually as a function of percent capacity filled in the storage device.

Example 13 may include the semiconductor apparatus of Example 12, wherein the logic coupled to the one or more substrates is to detect one or more invalid blocks in the multi-level cell region, determine a program mode of a pending write operation, erase the one or more invalid blocks in accordance with the program mode, and program the erased one or more invalid blocks in accordance with the program mode.

Example 14 may include the semiconductor apparatus of Example 13, wherein the program mode is to be either a single-level cell program mode or a multi-level cell program mode.

Example 15 may include the semiconductor apparatus of Example 12, wherein when the storage device is in a runtime state, the programmable eviction ratio is to be retrieved from a data structure dedicated to the runtime state and the portion converted into the multi-level cell region is to be from a dynamic single-level cell region.

Example 16 may include the semiconductor apparatus of any one of Examples 12 to 15, wherein when the storage device is in an idle state, the programmable eviction ratio is to be retrieved from a data structure dedicated to the idle state.

Example 17 may include the semiconductor apparatus of Example 16, wherein the portion converted into the multi-level cell region is to be from a static single-level cell region.

Example 18 may include the semiconductor apparatus of Example 16, wherein the portion converted into the multi-level cell region is to be from a dynamic single-level cell region having a lower eviction priority than a static single-level cell region of the storage device.

Example 19 may include a method comprising determining a programmable eviction ratio associated with a storage device, and converting a portion of a single-level cell region in the storage device into a multi-level cell region in accordance with the programmable eviction ratio, wherein an amount of the portion converted into the multi-level cell region varies gradually as a function of percent capacity filled in the storage device.

Example 20 may include the method of Example 19, further including detecting one or more invalid blocks in the multi-level cell region, determining a program mode of a pending write operation, erasing the one or more invalid blocks in accordance with the program mode, and programming the erased one or more invalid blocks in accordance with the program mode.

Example 21 may include the method of Example 20, wherein the program mode is either a single-level cell program mode or a multi-level cell program mode.

Example 22 may include the method of Example 19, wherein when the storage device is in a runtime state, the programmable eviction ratio is retrieved from a data structure dedicated to the runtime state and the portion converted into the multi-level cell region is from a dynamic single-level cell region.

Example 23 may include the method of any one of Examples 19 to 22, wherein when the storage device is in an idle state, the programmable eviction ratio is retrieved from a data structure dedicated to the idle state.

Example 24 may include the method of Example 23, wherein the portion converted into the multi-level cell region is from a static single-level cell region.

Example 25 may include the method of Example 23, wherein the portion converted into the multi-level cell region is from a dynamic single-level cell region having a lower eviction priority than a static single-level cell region of the storage device.

Example 26 may include a memory controller comprising means for determining a programmable eviction ratio associated with a storage device, and means for converting a portion of a single-level cell region in the storage device into a multi-level cell region in accordance with the programmable eviction ratio, wherein an amount of the portion converted into the multi-level cell region is to vary gradually as a function of percent capacity filled in the storage device.

Example 27 may include the memory controller of Example 26, further including means for detecting one or more invalid blocks in the multi-level cell region, means for determining a program mode of a pending write operation, means for erasing the one or more invalid blocks in accordance with the program mode, and means for programming the erased one or more invalid blocks in accordance with the program mode.

Example 28 may include the memory controller of Example 27, wherein the program mode is to be either a single-level cell program mode or a multi-level cell program mode.

Example 29 may include the memory controller of Example 26, wherein when the storage device is in a runtime state, the programmable eviction ratio is to be retrieved from a data structure dedicated to the runtime state and the portion converted into the multi-level cell region is to be from a dynamic single-level cell region.

Example 30 may include the memory controller of any one of Examples 26 to 29, wherein when the storage device is in an idle state, the programmable eviction ratio is to be retrieved from a data structure dedicated to the idle state.

Example 31 may include the memory controller of Example 30, wherein the portion converted into the multi-level cell region is to be from a static single-level cell region.

Example 32 may include the memory controller of Example 30, wherein the portion converted into the multi-level cell region is to be from a dynamic single-level cell region having a lower eviction priority than a static single-level cell region of the storage device.

Example 33 may include the semiconductor apparatus of Example 1, wherein the logic coupled to the one or more substrates includes transistor channel regions that are positioned within the one or more substrates.

Example 34 may include the semiconductor apparatus of Example 12, wherein the logic coupled to the one or more substrates includes transistor channel regions that are positioned within the one or more substrates.

High performance and low cost technology described herein may therefore provide for a distributed eviction policy when dynamic SLC is used. As a result, sustained write bandwidths may be achieved when the storage device is actively performing write operations (e.g., runtime state).

Additionally, with respect to idle eviction of SLC regions to MLC regions, the full dynamic SLC region may be available until approximately 50% of the drive is filled. From 50% to 100%, the dynamic SLC region may still be available (although the DSLC region size may decrease with increasing drive capacity). If the idle time is less than the amount of time called for to flush the static SLC buffer size, whatever SLC buffer size is freed may be made available to the user. If the idle time is more than the amount of time called for to flush the static SLC buffer size but less than the dynamic SLC region size at that capacity, the freed up SLC buffer size (static plus dynamic) may be made available to the user. If the idle time is more than the amount of time called for to flush the dynamic SLC region at that capacity, the maximum dynamic SLC region at that capacity may be made available to the user.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
determine a programmable eviction ratio associated with a storage device,
convert a portion of a single-level cell region in the storage device into a multi-level cell region in accordance with the programmable eviction ratio, wherein an amount of the portion converted into the multi-level cell region is to vary gradually as a function of percent capacity filled in the storage device,
detect one or more invalid blocks in the multi-level cell region,
determine a program mode of a pending write operation,
erase the one or more invalid blocks in accordance with the program mode, and
program the erased one or more invalid blocks in accordance with the program mode, wherein the program mode is to be either a single-level cell program mode or a multi-level cell program mode,
wherein when the storage device is in a runtime state, the programmable eviction ratio is to be retrieved from a data structure dedicated to the runtime state, and wherein when the storage device is in an idle state, the programmable eviction ratio is to be retrieved from a data structure dedicated to the idle state.

2. The semiconductor apparatus of claim 1, wherein when the storage device is in the runtime state, the portion converted into the multi-level cell region is to be from a dynamic single-level cell region.

3. The semiconductor apparatus of claim 1, wherein when the storage device is in the idle state, the portion converted into the multi-level cell region is to be from a static single-level cell region.

4. The semiconductor apparatus of claim 1, wherein when the storage device is in the idle state, the portion converted into the multi-level cell region is to be from a dynamic single-level cell region having a lower eviction priority than a static single-level cell region of the storage device.

5. A storage device comprising:
a power supply to provide power to the storage device;
a memory array including a single-level cell region and a multi-level cell region;
a memory controller including logic to:
determine a programmable eviction ratio associated with the storage device, and
convert a portion of the single-level cell region into the multi-level cell region in accordance with the programmable eviction ratio, wherein an amount of the portion converted into the multi-level cell region is to vary gradually as a function of percent capacity filled in the storage device.

6. The storage device of claim 5, wherein the memory controller is to:
detect one or more invalid blocks in the multi-level cell region,
determine a program mode of a pending write operation,
erase the one or more invalid blocks in accordance with the program mode, and
program the erased one or more invalid blocks in accordance with the program mode.

7. The storage device of claim 6, wherein the program mode is to be either a single-level cell program mode or a multi-level cell program mode.

8. The storage device of claim 5, wherein when the storage device is in a runtime state, the programmable eviction ratio is retrieved from a data structure dedicated to the runtime state and the single-level cell region is a dynamic single-level cell region.

9. The storage device of claim 5, wherein when the storage device is in an idle state, the programmable eviction ratio is to be retrieved from a data structure dedicated to the idle state.

10. The storage device of claim 9, wherein the single-level cell region is a static single-level cell region.

11. The storage device of claim 9, wherein the single-level cell region is a dynamic single-level cell region having a lower eviction priority than a static single-level cell region of the storage device.

12. A semiconductor apparatus comprising:
one or more substrates; and
logic coupled to the one or more substrates, wherein the logic is implemented at least partly in one or more of configurable logic or fixed-functionality hardware logic, the logic coupled to the one or more substrates to:
determine a programmable eviction ratio associated with a storage device, and
convert a portion of a single-level cell region in the storage device into a multi-level cell region in accordance with the programmable eviction ratio, wherein an amount of the portion converted into the multi-level cell region is to vary gradually as a function of percent capacity filled in the storage device.

13. The semiconductor apparatus of claim 12, wherein the logic coupled to the one or more substrates is to:
detect one or more invalid blocks in the multi-level cell region,
determine a program mode of a pending write operation,
erase the one or more invalid blocks in accordance with the program mode, and
program the erased one or more invalid blocks in accordance with the program mode.

14. The semiconductor apparatus of claim 13, wherein the program mode is to be either a single-level cell program mode or a multi-level cell program mode.

15. The semiconductor apparatus of claim 12, wherein when the storage device is in a runtime state, the programmable eviction ratio is to be retrieved from a data structure dedicated to the runtime state and the portion converted into the multi-level cell region is to be from a dynamic single-level cell region.

16. The semiconductor apparatus of claim 12, wherein when the storage device is in an idle state, the programmable eviction ratio is to be retrieved from a data structure dedicated to the idle state.

17. The semiconductor apparatus of claim 16, wherein the portion converted into the multi-level cell region is to be from a static single-level cell region.

18. The semiconductor apparatus of claim 16, wherein the portion converted into the multi-level cell region is to be from a dynamic single-level cell region having a lower eviction priority than a static single-level cell region of the storage device.

19. A method comprising:
determining a programmable eviction ratio associated with a storage device comprising a memory controller; and
converting, using the memory controller, a portion of a single-level cell region in the storage device into a multi-level cell region in accordance with the programmable eviction ratio, wherein an amount of the portion converted into the multi-level cell region varies gradually as a function of percent capacity filled in the storage device.

20. The method of claim 19, further including:
detecting one or more invalid blocks in the multi-level cell region;
determining a program mode of a pending write operation;
erasing the one or more invalid blocks in accordance with the program mode; and
programming the erased one or more invalid blocks in accordance with the program mode.

21. The method of claim 20, wherein the program mode is either a single-level cell program mode or a multi-level cell program mode.

22. The method of claim 19, wherein when the storage device is in a runtime state, the programmable eviction ratio is retrieved from a data structure dedicated to the runtime state and the portion converted into the multi-level cell region is from a dynamic single-level cell region.

23. The method of claim 19, wherein when the storage device is in an idle state, the programmable eviction ratio is retrieved from a data structure dedicated to the idle state.

24. The method of claim 23, wherein the portion converted into the multi-level cell region is from a static single-level cell region.

25. The method of claim 23, wherein the portion converted into the multi-level cell region is from a dynamic single-level cell region having a lower eviction priority than a static single-level cell region of the storage device.

* * * * *